United States Patent [19]

Boyce et al.

[11] Patent Number: 5,186,776
[45] Date of Patent: Feb. 16, 1993

[54] COMPOSITE LAMINATE TRANSLAMINAR REINFORCEMENT APPARATUS AND METHOD

[75] Inventors: Joseph S. Boyce, Hanover, Mass.; James P. Ross, Hudson, N.H.; Stephen C. Jens, Ashland; David A. Evans, Chelmsford, both of Mass.

[73] Assignee: Foster-Miller, Inc., Waltham, Mass.

[21] Appl. No.: 915,789

[22] Filed: Jul. 17, 1992

Related U.S. Application Data

[63] Continuation of Ser. No. 520,210, May 7, 1990, abandoned.

[51] Int. Cl.⁵ .................. B32B 31/16; B32B 7/08
[52] U.S. Cl. .................. 156/73.2; 156/73.1; 156/92; 156/93; 156/580.1; 264/23; 112/262.1
[58] Field of Search .................. 156/73.1, 73.2, 580.1, 156/580.2, 64, 92, 93, 350; 264/23; 425/174.2; 228/1.1, 110; 112/262.1

[56] References Cited

U.S. PATENT DOCUMENTS

| | | | |
|---|---|---|---|
| 2,557,668 | 6/1951 | Lincoln | 156/93 X |
| 3,031,349 | 4/1962 | Dritz | 156/93 X |
| 3,122,465 | 2/1964 | Keller et al. | 156/93 |
| 3,146,141 | 8/1964 | Woodland | 156/73.1 |
| 3,243,332 | 3/1966 | Dritz | 156/93 X |
| 3,357,090 | 12/1967 | Tiffany | 29/470 |
| 3,367,809 | 2/1968 | Soloff | 156/73.1 |
| 3,384,283 | 5/1968 | Mims | 228/1 |
| 3,401,861 | 9/1968 | Folk | 228/1.1 |
| 3,440,117 | 4/1969 | Soloff et al. | 156/73.1 |
| 3,460,238 | 8/1969 | Christy et al. | 228/1.1 |
| 3,480,492 | 11/1969 | Hauser | 156/73.1 |
| 3,666,599 | 5/1972 | Obeda | 156/73.2 X |
| 3,837,985 | 9/1974 | Chase | 161/55 |
| 4,027,370 | 6/1977 | Bachar | 29/818 |
| 4,109,435 | 8/1978 | Loyd | 52/309.1 |
| 4,247,345 | 1/1981 | Kadija et al. | 156/73.4 |
| 4,299,871 | 11/1981 | Forsch | 428/104 |
| 4,350,728 | 9/1982 | Huang et al. | 428/105 |
| 4,373,653 | 2/1983 | Salzer et al. | 156/73.2 X |
| 4,528,051 | 7/1985 | Heinze et al. | 156/92 |
| 4,541,349 | 9/1985 | Inoue | 156/73.2 X |
| 4,556,591 | 12/1985 | Bannink, Jr. | 428/43 |
| 4,556,592 | 12/1985 | Bannink, Jr. | 428/43 |
| 4,582,740 | 4/1986 | Zurcher et al. | 156/73.2 X |
| 4,761,871 | 8/1988 | O'Connor et al. | 29/432.1 |
| 4,786,343 | 11/1988 | Hertzberg | 156/93 |
| 4,798,639 | 1/1989 | Yamaguchi | 156/73.1 |
| 4,863,551 | 9/1989 | Ogura | 156/64 X |

FOREIGN PATENT DOCUMENTS 4101878 10/1979 Japan .................. 264/23

OTHER PUBLICATIONS

I.B.M. T.D.B., vol. 15, No. 3, Aug. 1972.
General Dynamics, David T. Uhl, Final Report, Apr. 1988, U.S. Government Contract No. AFWAL-TR-88-4004.

Primary Examiner—David A. Simmons
Assistant Examiner—J. Sells
Attorney, Agent, or Firm—Iandiorio & Dingman

[57] ABSTRACT

A technique for the translaminar reinforcement in the z-axis direction of composite laminates utilizing an apparatus and method for heating and softening the composite laminates by ultrasonic energy, penetrating the composite laminate, moving the composite laminate fibers aside, inserting a reinforcing fiber into the composite laminate and allowing the composite laminate and reinforcement fiber to cool and bond.

1 Claim, 4 Drawing Sheets

COMPOSITE LAMINATE TRANSLAMINAR REINFORCEMENT APPARATUS AND METHOD

STATEMENT OF GOVERNMENT INTEREST

Funding for the present invention was obtained from the Government of the United States by virtue of Air Force Contract No. F33615-86-C-3232. Thus, the Government of the United States has certain rights in and to the invention claimed herein.

This is a continuation of application Ser. No. 07/520,210, filed May 7, 1990, now abandoned.

FIELD OF THE INVENTION

This invention relates to the field of reinforcing composite laminates in a transverse direction to increase their resistance to delamination and debonding and more particularly to the insertion of reinforcement fibers in the z-axis direction in such a way as to increase resistance to delamination but not degrade the strength of the composite laminate by shearing the fibers interdisposed in the composite laminate.

BACKGROUND OF THE INVENTION

Composite laminate structures offer a variety of properties not available in metal counterparts, and are extensively utilized in aerospace, automotive, marine and other applications. Most standard composite laminate fabrication techniques result in a composite laminate structure of individual layers or piles consisting of fiber reinforcement in a resin matrix, the matrix resin being relatively weak without the reinforcement. Interlaminar properties of such a composite laminate structure are weak in comparison with in-plane properties of the composite. For example, the weak interply region is an area for each crack propagation. Cracks can be caused by thermal effects, impact events or the presence of holes or edges. Structural failure can often be traced to interply cracking. Impact damaged panels will often fail catastrophically, when subject to compression or flexural loading. Also, the presence of such cracks severely reduces the compressive strength of the composite laminate and can lead to early delamination and failure.

A number of methods for improving the strength of such composite laminate structures have been investigated and include the use of stitching, stapling and needling. Such techniques tend to damage the main reinforcement fibers in the composite laminate and cause a reduction of in-plane properties. Also, the uncured composite laminate lay-ups must be removed from the lay-up tool and passed through the stitching or needling machine. This operation can cause further damage, particularly if the laminate is larger or of complicated shape.

It is an object of this invention to provide an improved method of composite laminate reinforcement which obtains the benefit of stitching, in terms of limiting delamination, while at the same time minimizing damage to the uncured laminate and its main reinforcement structures.

It is a further object of this invention to incorporate such a method in an apparatus which is portable, fast acting and applicable to curved surfaces, can be readily utilized over a layup on-tool to quickly reinforce critical areas (leading edges, around holes, fasteners, along stringers, etc.) and can also be utilized without removal of the layup from its mold thus avoiding handling problems associated with the stitching and stapling processes.

SUMMARY OF THE INVENTION

The present invention is directed to the use of a technique of softening a composite laminate, moving the composite laminate's composite fibers aside while inserting a reinforcement fiber and allowing the reinforcement fiber to remain in the composite laminate for providing reinforcement of the strength of the composite laminate in the z-axis direction. Softening of the composite laminate structure is achieved by utilizing ultrasonic energy to heat the composite laminate. The ultrasonic energy is transmitted to the composite laminate via a small hollow needle attached or incorporated on one end of an ultrasonic horn. The ultrasonic driven hollow needle is inserted into the composite laminate heating and softening the laminate and thus allowing the composite laminate's fibers to be nudged and forced out of the path of the needle and not sheared or broken by the needle. A reinforcement fiber made from a similar material as the composite laminate and also capable of being heated by ultrasonic energy is inserted into the base of the needle before, during or after the insertion of the needle into the composite laminate structure. Reinforcement fibers of differing materials may also be utilized. After the needle has penetrated the composite laminate to a predetermined position the needle is withdrawn while leaving the reinforcement fiber in the needle's place to bond with the heated composite laminate structure and provide reinforcement in the z-axis direction.

BRIEF DESCRIPTION OF THE DRAWINGS

The following is a brief description of the drawings.

DESCRIPTION OF PARTICULAR EMBODIMENTS

Figure 1:
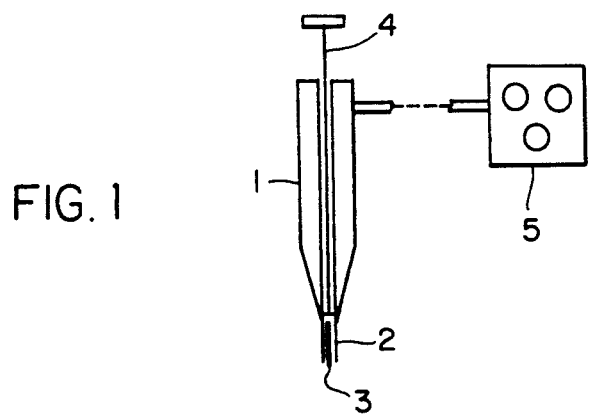
FIG. 1 is a diagrammatic view of a simple insertion apparatus for fiber reinforcement.

The ultrasonic horn (1) shown in FIG. 1 is excited at about 20,000 Hz and about a 125 micron amplitude. The hollow tip (2) is a stainless steel or other corrosion resistant high strength alloy with an outside diameter of about 0.032 in. and an inside diameter of about 0.020 in. The glass, thermoplastic, boron, graphite or other choice for reinforcement fiber (3) is about 0.018 in. in diameter. The ultrasonic power supply (5) is remote from the ultrasonic horn (1) and is connected by a power cable. A device (4) for feeding the fiber (3) and forcing of the fiber out of the tip (2) is shown in FIG. 1 as manually controlled.

Figure 2:
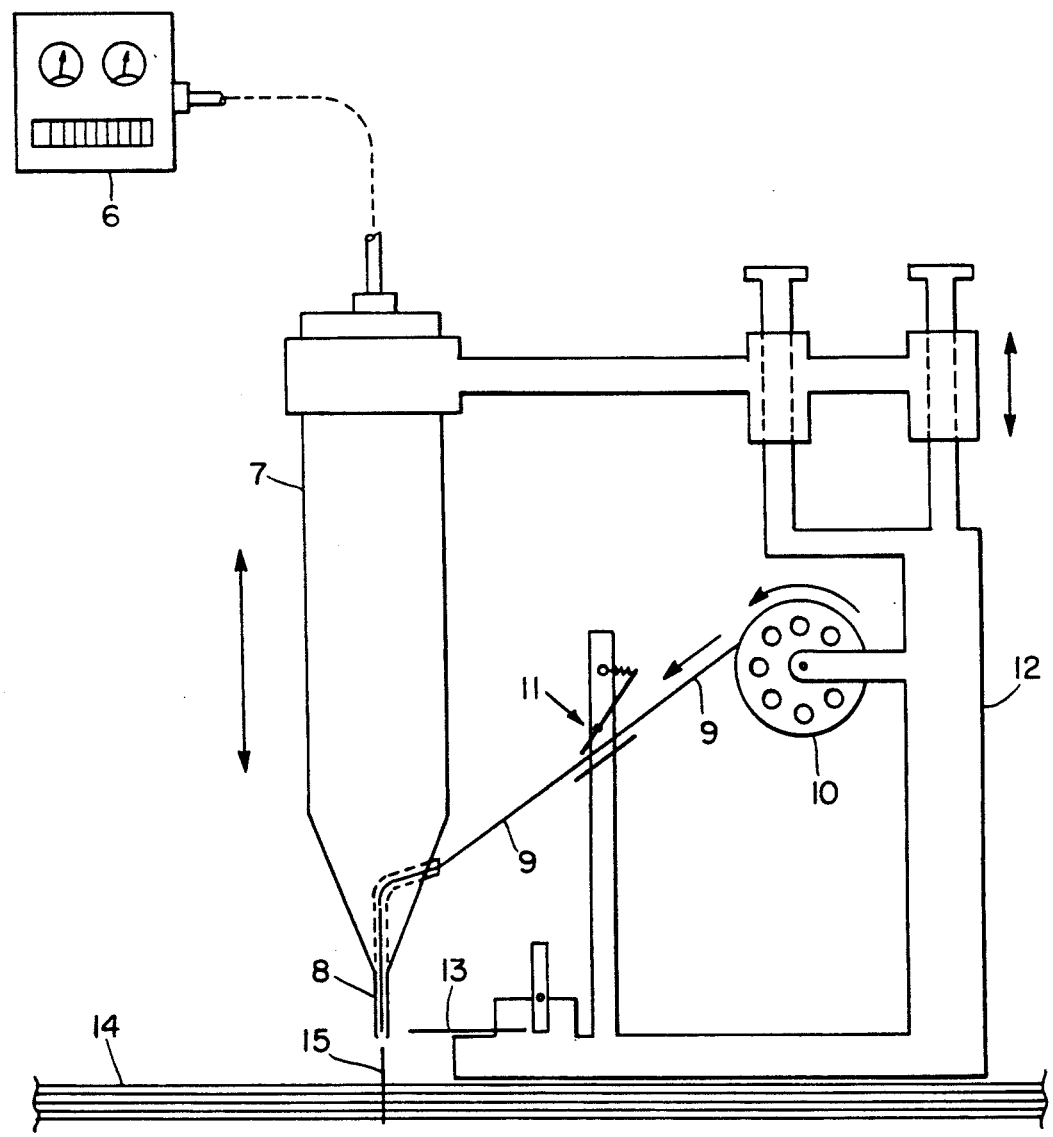
FIG. 2 is a diagrammatic view of another insertion apparatus for fiber reinforcement.

In another particular embodiment as shown in FIG. 2 the ultrasonic horn (7) is slideably mounted on a frame (12) for guiding the tip (8) into and out of a composite laminate (14). A supply of reinforcement fiber (9) is stored on a reel (10) or similar type spool and is fed into the tip (8) by the one way action of the feed mechanism (11). The one way action of the feed mechanism (11) is depicted as a biased pinching device, however, other means are described herein. The feed mechanism (11) operates to restrict the movement of the reinforcement fiber from moving in the direction of reel (10) during the upstroke of the ultrasonic horn (7). Such restriction of the movement of the fiber (9) by the feeding mechanism (11) causes the fiber (9) to be pushed into the tip (8) on the upstroke of ultrasonic horn (7). A cutting means (13) operates to sever the fiber (15) already inserted into composite laminate (14).

Figure 3:
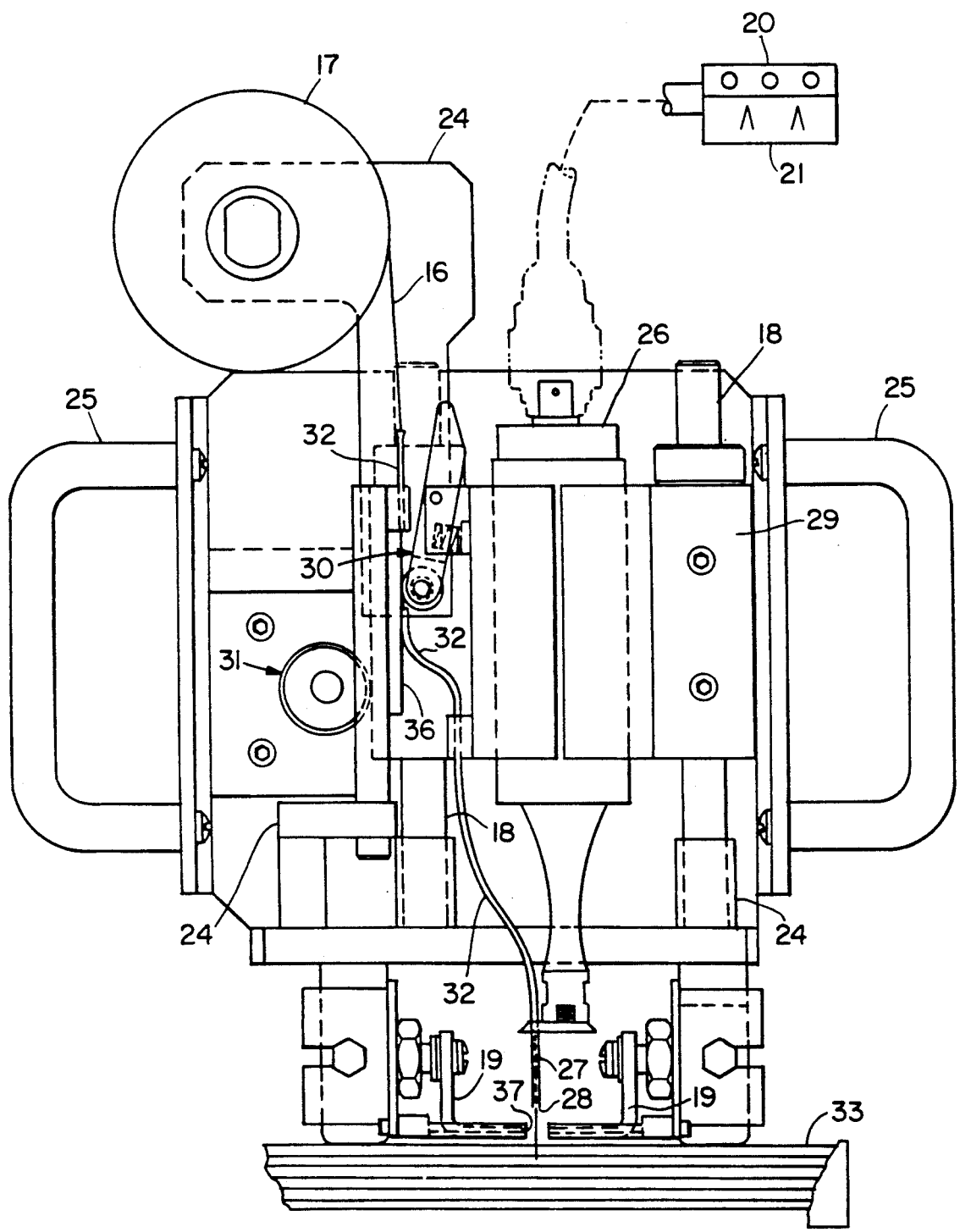
FIG. 3 is a diagrammatic view of a portable hand held insertion apparatus for fiber reinforcement.

In the preferred embodiment as shown in FIG. 3 the ultrasonic horn (26) is affixed to sliding members (29) which are moved up and down by pneumatic or electric means on guides (18) mounted to a frame (24). Handles (25) are mounted on frame (24) for positioning the aperture (37) over the location for the insertion of the tip (27). A reel (17) is provided for supplying fiber (16) through fiber guides (32) to guide the fiber (16) to and from the fiber feed mechanism (35) and to the tip (27). The fiber feed mechanism (30) is detailed in FIG. 4 and more fully described later. Cutting blades (19) activated in conjunction by pneumatic or electric means with each other by moving together simultaneously to sever the fiber (16) after the fiber (16) has been inserted into the composite laminate (33). The cutters are activated by control circuit (21) whose logic is detailed in FIG. 5 and more fully described later. An ultrasonic power supply (20) provides power to the ultrasonic horn (26). A sensor (31) and control circuit (21) function to control the apparatus shown in FIG. 3 in a control manner as detailed in FIG. 5.

Figure 4:
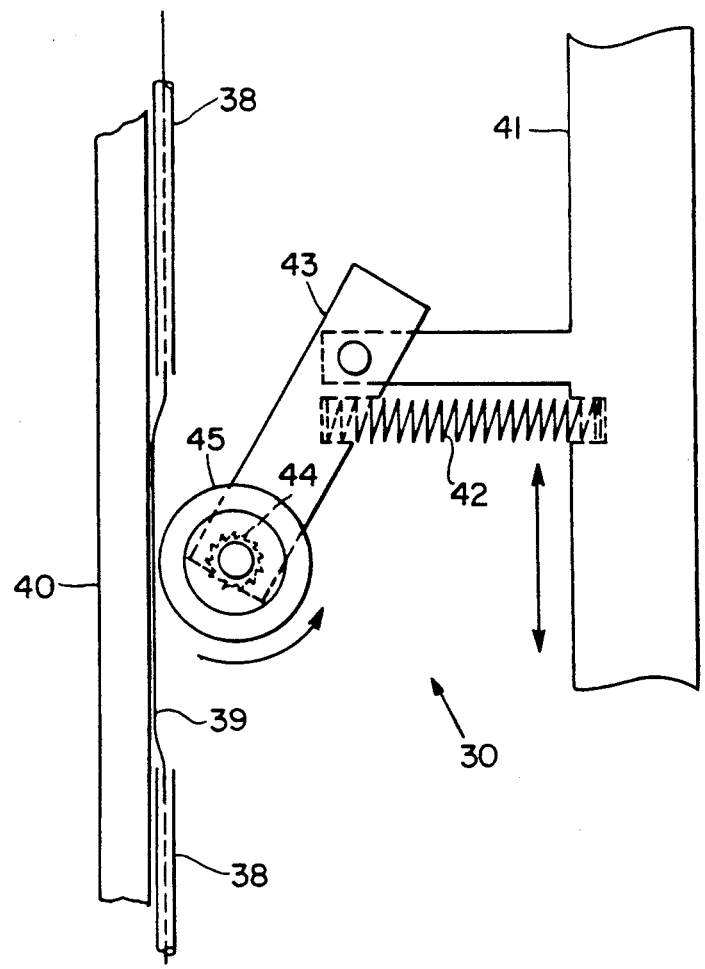
FIG. 4 is a diagrammatic view of a reinforcement fiber feeding mechanism for the portable hand held apparatus for fiber insertion.

FIG. 4 is a diagrammatic view of the fiber feeding device (30) as shown in FIG. 3. In FIG. 3 support member (41) is attached to one of the sliding members (29) in FIG. 3 for movement up and down with the ultrasonic horn. Biasing means (42) biases lever (43) so as to force a rubber surfaced wheel (45) against a slide plate (40). A ratchet mechanism (44) in the hub of wheel (45) allows the rubber surfaced wheel (45) to turn in only one direction. The fiber (39) is guided by guides (38) into a position between the wheel (45) and the slide plate (40). As the support (41) moves down, the wheel (45) locks in position because of the internal ratchet (44). This locking action in combination with the downward stroke of horn (26) holds the fiber (39) in the tip (27) as it moves into the composite laminate and also unwinds more fiber from the reel. The wheel (45) rotates freely in the other direction as the support (41) and horn (26) move upward and the wheel (45) rotates to allow the fiber (39) to remain in the composite laminate as the tip (27) is withdrawn.

Figure 5:
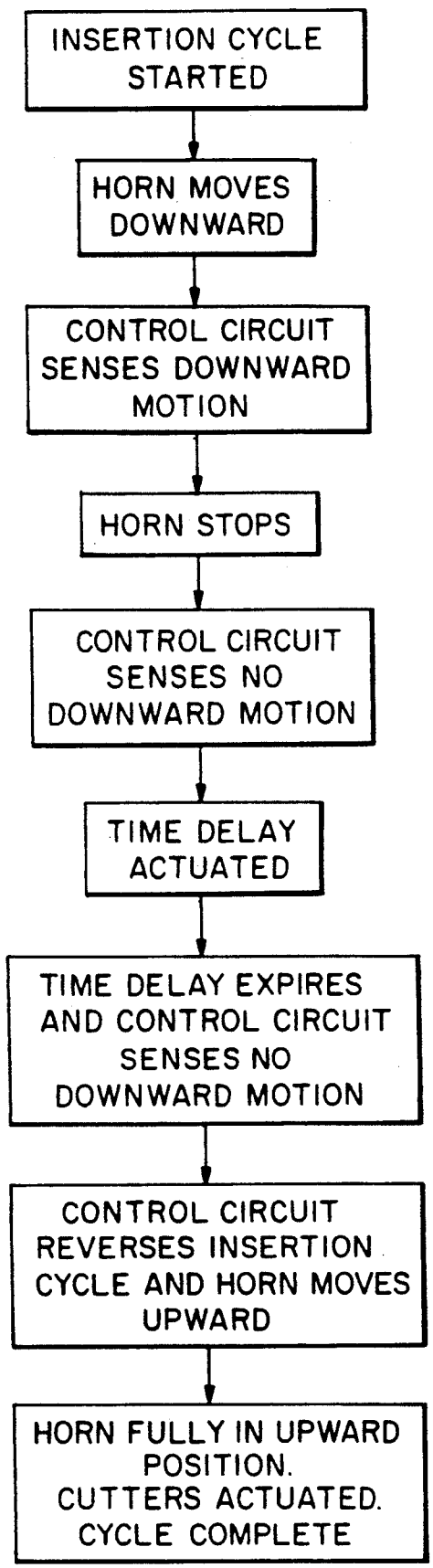
FIG. 5 is a diagram of the control logic for the portable hand held reinforcement fiber insertion apparatus.

In another preferred embodiment FIG. 5 depicts a control logic sequence as sensed and controlled by sensor (31) and control circuit (21) as shown in FIG. 3.

Figure 6:
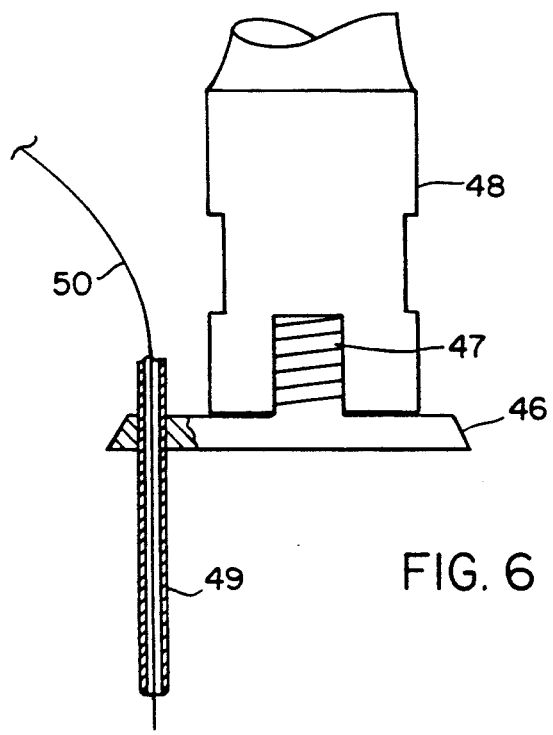
FIG. 6 is a diagrammatic view of a removable and replaceable tip attached to an ultrasonic horn.

Another preferred embodiment is the replaceable tip structure shown in FIG. 6. A plate (46) fabricated from titanium or other high strength alloy is fitted with treads (47) for insertion into mating threads in the ultrasonic horn (48). The plate area is larger than that of the area of the end of the ultrasonic horn and the plate is provided with a hole for press fitting or otherwise securing a hollow tip (49) fabricated from stainless steel or other high strength alloy for receiving fiber (50) and inserting fiber (50) into a composite laminate. The replaceable tip may be fabricated with a plurality of holes and hollow tips for the feed of multiple fibers and increased rates of production.

Figure 7:
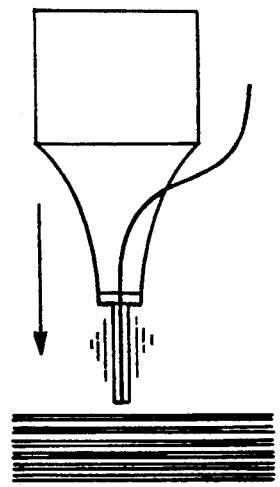
FIGS. 7, 8, 9 and 10 are illustrations of a reinforcement fiber insertion sequence.

FIGS. 7, 8, 9 and 10 illustrate a sequence of fiber insertion and composite laminate reinforcement. FIG. 7 illustrates an ultrasonic horn with a vibrating hollow tip descending.

Figure 8:
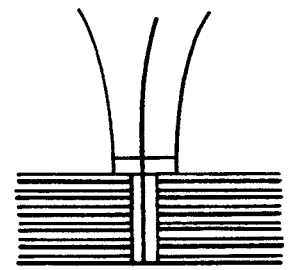

FIG. 8 illustrates the tip penetrating the composite laminate and carrying the fiber into the laminate.

Figure 9:
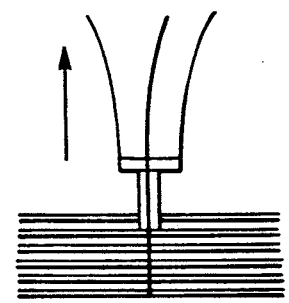

FIG. 9 illustrates the tip withdrawing from the laminate leaving the fiber in place in the laminate.

Figure 10:
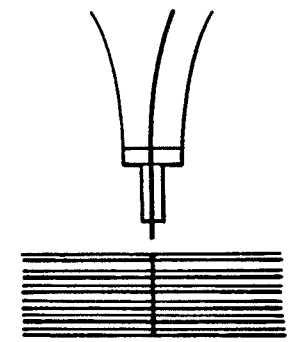

FIG. 10 illustrates the cut off fiber remaining in the laminate for reinforcement of the laminate in the z-axis direction.

While the above embodiments represent the current preferred embodiment of the invention, modifications thereof will occur to those skilled in the art within the spirit and scope of the invention. Accordingly, the invention is not to be construed as limited to the specific embodiments described above, except as defined by the appended claims.

What is claimed is:

1. A method of inserting a thermally stable reinforcement fiber into a composite laminate for z-axis reinforcement of the laminate, comprising:

providing an elongated, hollow-core needle;
   ultrasonically vibrating the needle;
   inserting said vibrating needle transversely into a composite laminate to both heat and soften the composite laminate while nudging the composite fibers out of the needle's insertion path to effect a tunnel for guiding the fiber into the laminate;
   feeding a reinforcement fiber axially into the hollow core of the needle before, during or after insertion of the needle into the composite laminate to insert the fiber into the laminate;
   inhibiting the retraction of the reinforcement fiber from its position in the composite laminate; and
   retracting the needle and cutting off the reinforcement fiber leaving the fiber embedded in the laminate to bond with the heated surrounding composite laminate.

* * * * *